United States Patent [19]
Yoshizawa et al.

[11] Patent Number: 5,925,403
[45] Date of Patent: Jul. 20, 1999

[54] METHOD OF COATING A COPPER FILM ON A CERAMIC SUBSTRATE

[75] Inventors: Izuru Yoshizawa, Nagaokakyo; Hiroaki Takahashi, Hannan; Tomoyuki Kawahara, Kadoma, all of Japan

[73] Assignee: Matsushita Electric Works, Ltd., Osaka, Japan

[21] Appl. No.: 08/811,011

[22] Filed: Mar. 4, 1997

Related U.S. Application Data

[63] Continuation-in-part of application No. 08/377,360, Jan. 24, 1995., abandoned

[30] Foreign Application Priority Data

Jan. 31, 1994 [JP] Japan ............................... P06-009146
Jan. 31, 1994 [JP] Japan ............................... P06-009147
Jan. 31, 1994 [JP] Japan ............................... P06-009148

[51] Int. Cl.$^6$ ...................................................... B05D 5/12
[52] U.S. Cl. ................................... 427/126.3; 427/376.2; 427/376.6; 427/377; 427/419.2; 427/443.1
[58] Field of Search .................................. 427/126.3, 78, 427/376.2, 376.6, 377, 419.2, 443.1

[56] References Cited

U.S. PATENT DOCUMENTS

| | | | |
|---|---|---|---|
| 3,650,747 | 3/1972 | Calligaris et al. | 96/48 |
| 3,804,638 | 4/1974 | Jonker et al. | 106/1 |
| 4,234,628 | 11/1980 | DuRose | 427/305 |
| 4,539,044 | 9/1985 | Abu-Moustafa et al. | 106/1.23 |

FOREIGN PATENT DOCUMENTS

| | | | |
|---|---|---|---|
| 0 189 913 | 8/1986 | European Pat. Off. | C23C 18/38 |
| 0 321 067 | 6/1989 | European Pat. Off. | C23C 18/40 |
| 53-31160 | 3/1978 | Japan | C07D 209/08 |
| 63-4336 | 1/1988 | Japan | H01G 4/12 |
| 3-69191 | 10/1991 | Japan | H05K 3/18 |

*Primary Examiner*—William Powell
*Assistant Examiner*—George Goudreau

[57] ABSTRACT

An undercoat containing copper and bismuth and/or vanadium is formed on a ceramic substrate such as $Al_2O_3$. When the undercoat contains copper and bismuth, the ceramic substrate having the undercoat is heated at a temperature between 600° C. and 1100° C. in an oxidative atmosphere to obtain a fired undercoat on the ceramic substrate. The fired undercoat is formed with copper oxide particles and a binder phase containing bismuth and copper for bonding between adjacent copper oxide particles. A bismuth content in the fired undercoat is determined within a range of 10 to 90 wt %. When the undercoat contains copper and vanadium, the ceramic substrate having the undercoat is heated at a temperature between 450° C. and 1100° C. in the oxidative atmosphere to obtain a fired undercoat which is formed with copper oxide particles and a binder phase containing vanadium and copper. A vanadium content in the fired undercoat is determined within a range of 3 to 63 wt %. The copper oxide particles are reduced by the use of a reducing solution to obtain a reduced undercoat having metallic copper particles. The copper particles are partially exposed on a top surface of the reduced undercoat. Copper is coated on the top surface of the reduced undercoat to obtain a copper film on the ceramic substrate.

11 Claims, 6 Drawing Sheets

METHOD OF COATING A COPPER FILM ON A CERAMIC SUBSTRATE

This is a continuation-in-part of application Ser. No. 08/377,360, filed on Jan. 24, 1995, now abandoned.

BACKGROUND OF THE INVENTION

1. Field of the Invention

The present invention relates to a method of coating a copper film on a ceramic substrate, and particularly to a method of providing an improved adhesion between the copper film and the ceramic substrate.

2. Disclosure of the Prior Art

A method of coating a copper film on a ceramic substrate is provided in Japanese Patent Publication [KOKOKU] No. 63-4336. That is, the method uses a paste comprising at least one selected from the group consisting of compounds of copper, zinc, cadmium, bismuth, and lead. The paste is applied to a surface of a ceramic substrate to form an undercoat. After the ceramic substrate having the undercoat is heated at a temperature between 350° C. and 900° C. in a non-oxidative atmosphere to precipitate metal or alloy particles from the undercoat, it is treated by a solution including palladium and/or platinum ions to substitute surface portions of the metal or alloy particles by palladium and/or platinum. Subsequently, a metallic film of nickel, cobalt or copper, is formed on the treated undercoat by electroless plating. However, this prior art shows that a maximum adhesion strength of the copper film is only 2.75 kg/5 mm$\phi$, that is, 0.56 kg/4 mm$^2$.

On the other hand, Japanese Patent Publication [KOKOKU] No. 3-69191 discloses that a copper undercoat having a thickness between 0.5 $\mu$m and 2 $\mu$m is formed on a substrate of aluminum oxide by electroless plating. The undercoated substrate is heated at a temperature between 300° C. and 900° C. in an oxidative atmosphere, and then heated at a temperature between 200° C. and 900° C. in a reducing atmosphere. After a copper film having a thickness between 0.5 $\mu$m and 2 $\mu$m is formed on the reduced undercoat by electroless plating, an additional copper film is formed on the copper film by electroplating to obtain a required thickness thereof. However, in this method, since the oxidized undercoat must be reduced at the high temperature range, there causes a problem that the reduced undercoat usually exhibits a poor wetting property to a plating solution used for the electroless plating. This will bring about a poor adhesion between the copper film and the reduced undercoat. In addition, there is a problem that an expensive furnace for controlling the reducing atmosphere at the high temperature range is needed in this method.

Thus, there is room for further improvement with regard to the adhesion between the copper film and the ceramic substrate.

SUMMARY OF THE INVENTION

Therefore, a primary object of the present invention is to provide a method of coating a copper film on a ceramic substrate, and achieving an improved adhesion therebetween. That is, an undercoat containing copper and bismuth is formed on the ceramic substrate. The ceramic substrate having the undercoat is heated at a temperature between 600° C. and 1100° C. in an oxidative atmosphere to obtain a fired undercoat on the ceramic substrate. The fired undercoat is formed with copper oxide particles and a binder phase containing bismuth and copper for bonding between adjacent copper oxide particles. A bismuth content in the fired undercoat is determined within a range of 10 to 90 wt %. The copper oxide particles are then reduced by the use of a reducing solution to obtain a reduced undercoat having metallic copper particles. The copper particles is partially exposed on a top surface of the reduced undercoat. Copper is coated on the top surface of the reduced undercoat to obtain the copper film on the ceramic substrate. In the present invention, it has been found that when the bismuth content in the fired undercoat and the heat-treatment temperature are respectively determined within the above-defined ranges, an improved adhesion between the copper film and the ceramic substrate can be obtained. In addition, since the copper oxide particles are reduced by the reducing solution, it is possible to readily reduce the copper oxide particles without using an expensive furnace for controlling a reducing atmosphere at a high temperature.

In a preferred embodiment of the present invention, the undercoat is formed on the ceramic substrate by the use of a mixed resinate paste which is prepared by mixing a copper powder with a bismuth resinate paste.

It has been also found that when the undercoat is heated at a temperature between 800° C. and 950° C. in the oxidative atmosphere, and the bismuth content is determined within a range of 30 to 60 wt %, it is possible to provide a more improved adhesion between the copper film and the ceramic substrate.

Alternatively, a copper film having an improved adhesion to a ceramic substrate can be formed according to the following method. That is, an undercoat containing copper and vanadium is formed on the ceramic substrate. The ceramic substrate having the undercoat is heated at a temperature between 450° C. and 1100° C. in an oxidative atmosphere to obtain a fired undercoat on the ceramic substrate. The fired undercoat is formed with copper oxide particles and a binder phase containing vanadium and copper for bonding between adjacent copper oxide particles. A vanadium content in the fired undercoat is determined within a range of 3 to 63 wt %. The copper oxide particles are then reduced by the use of a reducing solution to obtain a reduced undercoat having metallic copper particles. The copper particles is partially exposed on a top surface of the reduced undercoat. Copper is coated on the top surface of the reduced undercoat to obtain the copper film on the ceramic substrate. In this method, it has been found that when the vanadium content in the fired undercoat and the heat-treatment temperature are respectively determined within the above defined ranges, an improved adhesion between the copper film and the ceramic substrate can be obtained.

In a preferred embodiment of the present invention, the undercoat is formed on the ceramic substrate by the use of a mixed resinate paste which is prepared by mixing a copper powder with a vanadium resinate paste.

It has been also founded that when the undercoat is heated at a temperature between 450° C. and 900° C. in the oxidative atmosphere, and the vanadium content is determined within a range of 7 to 30 wt %, it is possible to provide a more improved adhesion between the copper film and the ceramic substrate.

These and still objects and advantages will become apparent from the following description of the preferred examples of the invention when taken in conjunction with the attached drawings.

DETAIL DESCRIPTION OF THE INVENTION

An undercoat containing bismuth and copper is formed on a ceramic substrate. The ceramic substrate comprises oxide ceramics such as aluminum oxide, zirconium oxide, barium titanate, and cordierite, nitride ceramics such as silicon nitride and aluminum nitride, and carbide ceramics such as silicon carbide. It is preferred that the undercoat is formed on the ceramic substrate by the use of a mixed resinate paste which is prepared by mixing a copper powder with a bismuth resinate paste at a predetermined mixture ratio. In general, a resinate can be obtained by dissolving an organometallic salt in an organic solvent. A resinate paste used in the present invention can be defined as a material prepared by mixing the resinate with a resin component to obtain a desired flowability. It is also known as an metal-organic paste. The undercoat can be formed by applying a mixture of resinate pastes of copper and bismuth on the ceramic substrate. It is preferred that a thickness of the undercoat is determined within a range of 0.1 to 5 $\mu$m.

Figure 1:
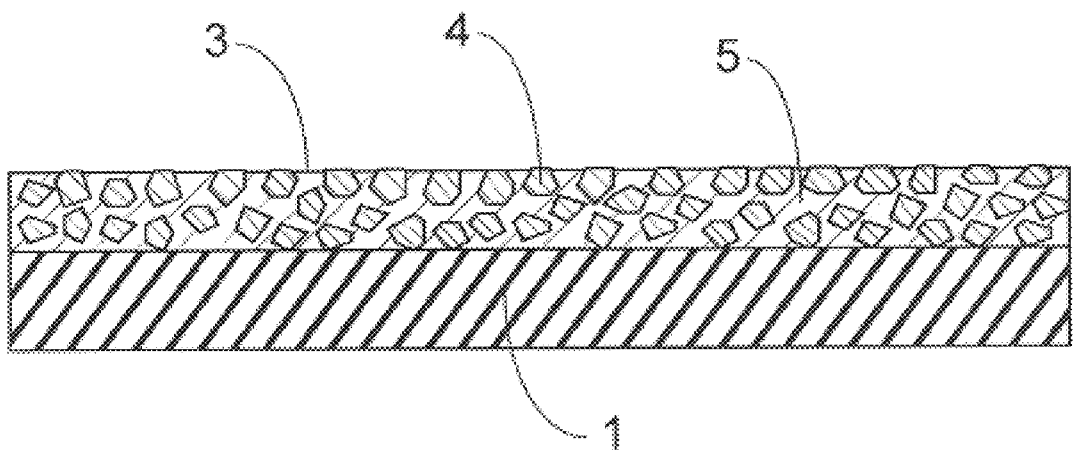
FIG. 1 is a cross-sectional view illustrating a fired undercoat formed on a ceramic substrate under a condition of the present invention.
Figure 2:
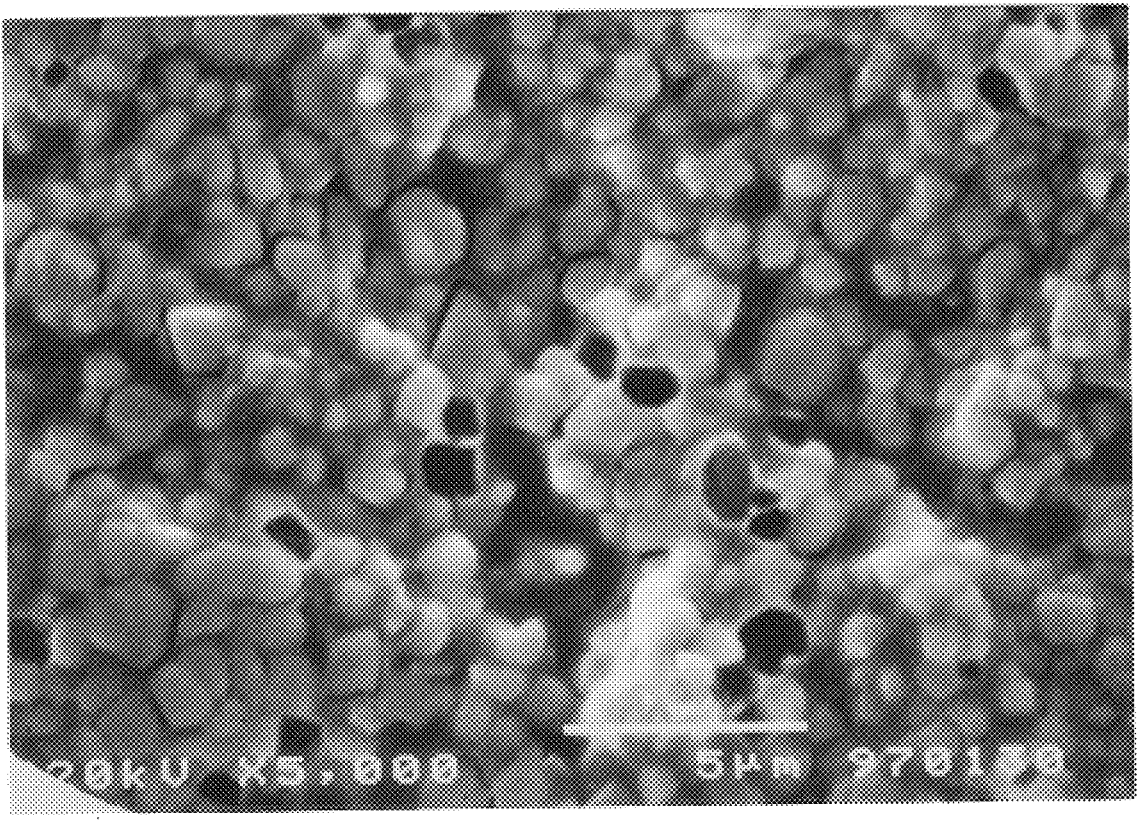
FIG. 2 is a SEM photograph of a fired undercoat of Example 7.

The ceramic substrate having the undercoat is heated at a temperature between 600° C. and 1100° C., and more preferably 800° C. and 950° C., in an oxidative atmosphere to obtain a fired undercoat 3 comprising copper oxide particles 4 and a binder phase 5 containing bismuth and copper for bonding between adjacent copper oxide particles, as shown in FIGS. 1 and 2. The binder phase may also contain an element diffused from the ceramic substrate during the heat-treatment. For example, when aluminum oxide is used as the ceramic substrate, the binder phase contains a complex oxide of bismuth, copper and aluminum supplied form the ceramic substrate. This brings about a good adhesion between the fired undercoat and the ceramic substrate. It is preferred that an average grain size of the copper oxide particles is in a range of 0.1 to 5 $\mu$m, and particularly about 1.5 $\mu$m. When the undercoat is formed on the ceramic substrate by the use of the bismuth resinate paste, organic components included in the undercoat may be vaporized during the heat-treatment. A bismuth content in the undercoat is determined such that bismuth content in the fired undercoat is within a range of 10 to 90 wt %, and more preferably 30 to 60 wt %.

Next, the copper oxide particles are reduced by the use of a reducing solution to obtain a reduced undercoat having metallic copper particles. When the copper oxide particles having a relatively large grain size are reduced, each of the obtained metallic copper particles may be formed with a surface region of metallic copper and a core region of copper oxide. The reduction of the copper oxide particles proceeds from a surface of the fired undercoat toward the inside. Therefore, the copper oxide particles exposed on the surface of the fired undercoat are preferentially reduced by the reducing solution. The binder phase of the fired undercoat is not reduced by the reducing solution. It is preferred that the copper oxide particles are reduced at a temperature between 20° C. and 100° C. A solution of a boron hydride salt, dimethylamine borane, a hypophosphite, or the like, can be used as the reducing solution. When the reducing solution is of dimethylamine borane, it is preferred to reduce the copper oxide particles at a temperature between 30° C. and 50° C. When the reducing solution is of the boron hydride salt, it is preferred to reduce the copper oxide particles at a temperature between 50° C. and 80° C. Thus, it is possible to readily reduce the copper oxide particles without using an expensive furnace for controlling a reducing atmosphere at a high temperature of more than 200° C. The metallic copper particles are partially exposed on a top surface of the reduced undercoat.

Figure 3:
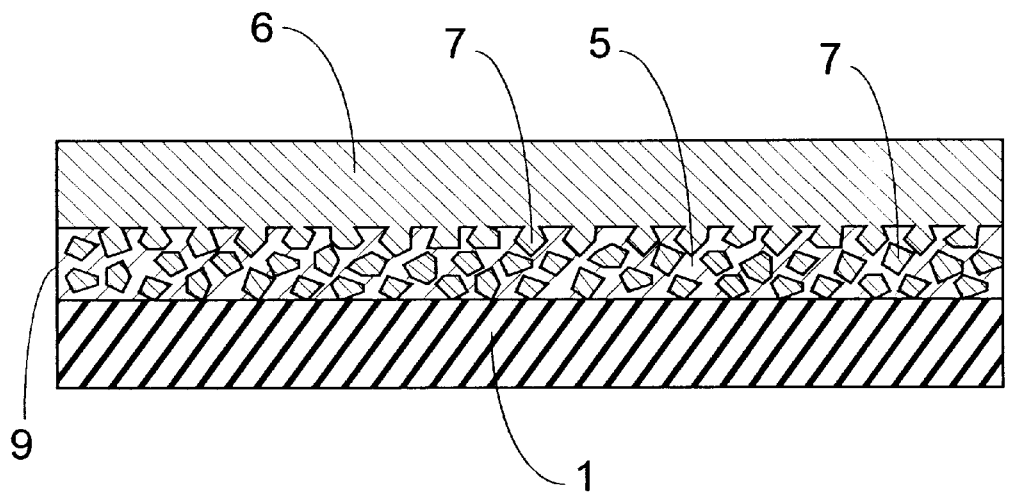
FIG. 3 is a cross sectional view illustrating a copper film formed on a reduced undercoat having metallic copper particles according to the present method.
Figure 4:
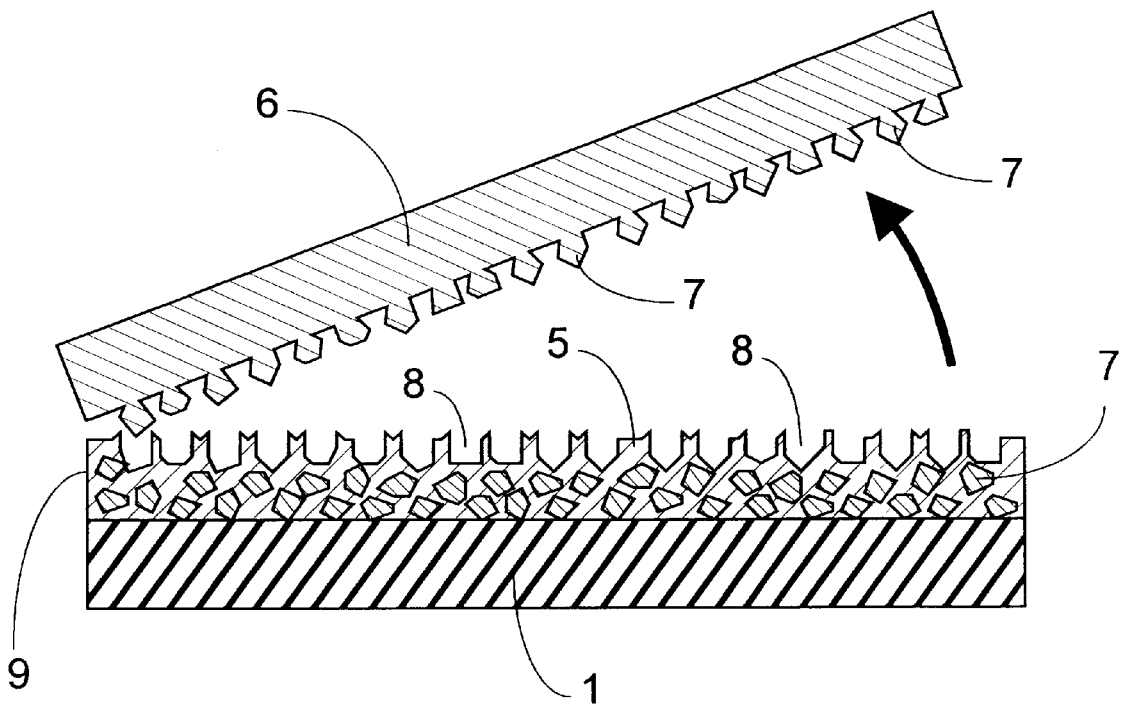
FIG. 4 is a cross sectional view illustrating a flaking mode of the copper film of FIG. 3.
Figure 5:
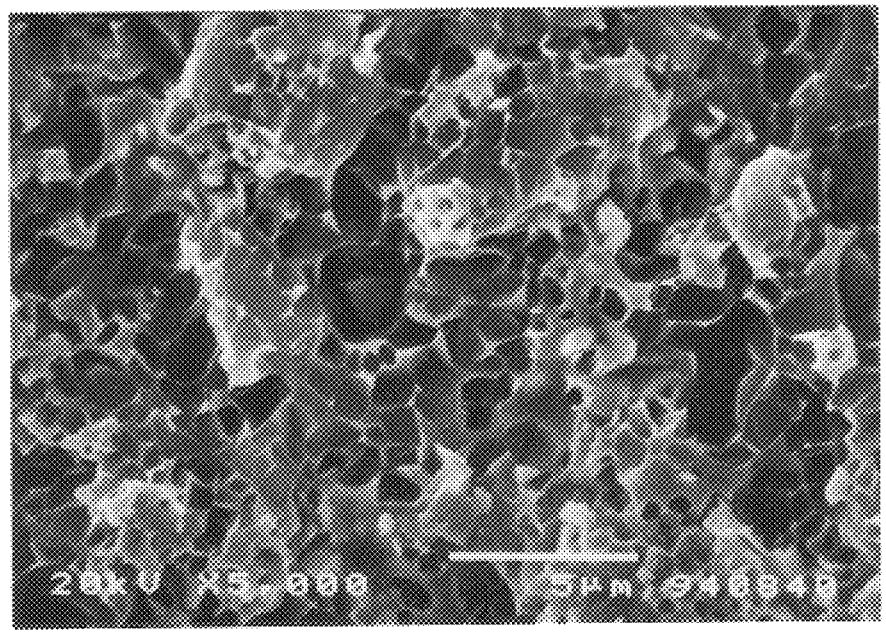
FIG. 5 is a SEM photograph of a flaking surface observed after a copper film is peeled off from a reduced undercoat.

As shown in FIG. 3, copper is coated on the top surface of the reduced undercoat 9 to form a copper film 6 on the ceramic substrate 1 through the reduced undercoat. For example, it is possible to perform the copper coating by electroless plating, electroplating, or a sputtering of copper. Since copper is directly coated on the exposed surfaces of the copper particles, a good adhesion between the copper film and the copper particles can be obtained. When the copper film 6 is peeled off from the ceramic substrate 1 for estimating an adhesion strength therebetween, it is observed that the copper particles 7 are pulled out from the reduced undercoat 9 while causing a plastic deformation of the binder phase 5, as shown in FIG. 4. As a result, it is observed that a large number of fine dimples 8 are formed on a flaking surface of the reduced undercoat 9, as shown in FIG. 5. The formation of such many dimples means that a large amount of energy is needed to peel off the copper film from the reduced undercoat. Therefore, the interface structure between the copper film and the reduced undercoat, which is as if the copper particles 7 projecting from to the copper film 6 are wedged in the binder phase 5 of the reduced undercoat 9, as shown in FIG. 3, is very effective to improve the adhesion therebetween.

Figure 6:
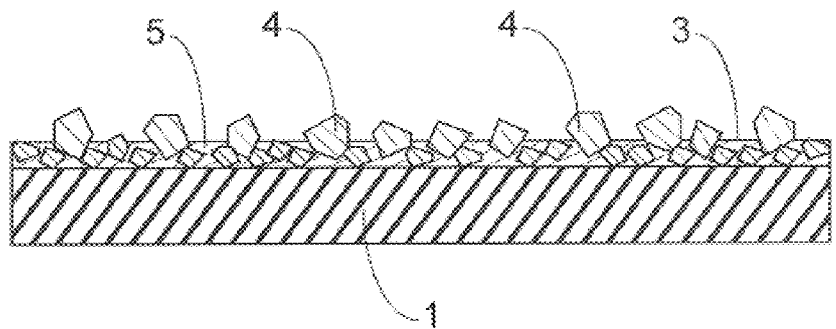
FIG. 6 is a cross-sectional view illustrating a fired undercoat formed on a ceramic substrate under a condition out of the present method.
Figure 7:
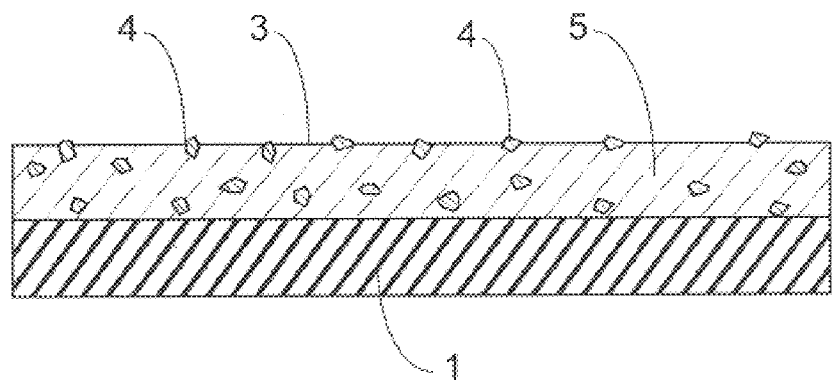
FIG. 7 is a cross-sectional view illustrating a fired undercoat formed on a ceramic substrate under another condition out of the present method.

In the present invention, it has been found that the bismuth content in the fired undercoat and the heat-treatment temperature must be respectively determined within the ranges described above to obtain the desired interface structure between the copper film and the reduced undercoat. That is, when the bismuth content is less than 10 wt %, or the heat-treatment temperature is less than 600° C., an amount of the binder phase 5 in the fired undercoat 3 is not sufficient to tightly bond between the adjacent copper oxide particles 4, as shown in FIG. 6. On the other hand, when the bismuth content is more than 90 wt %, or the heat-treatment temperature is more than 1100° C., an amount of the copper oxide particles 4 dispersed in the binder phase 5 is decreased, as shown in FIG. 7. As a result, since a total contact area between the copper film and the copper particles exposed on the top surface of the reduced undercoat is decreased, the adhesion between the copper film and reduced undercoat can not be improved sufficiently. When the bismuth content is determined within the range of 30 to 60 wt %, and the heat-treatment temperature is determined within the range between 800° C. and 950° C., it is possible to further improve the adhesion between the copper film and the reduced undercoat, as shown in the attached Examples.

The above explanation is directed to the method of coating the copper film on the ceramic substrate by the use of the undercoat containing bismuth and copper. However, a copper film having an improved adhesion to a ceramic substrate can be also obtained by the use of an undercoat containing vanadium and copper. A method of coating the copper film on the ceramic substrate by the use of the undercoat containing vanadium and copper is substantially same as the method using the undercoat containing bismuth and copper except for the following conditions. That is, a vanadium content in the undercoat is determined such that a vanadium content in a fired undercoat is in a range of 3 to 63 wt %, and preferably 7 to 30 wt %. The undercoat is heated at a temperature between 450° C. and 1100° C., and preferably 450° C. and 900° C. in an oxidative atmosphere. When the vanadium content and the heat-treatment temperature are determined respectively within the above ranges, an improved adhesion between the copper film and the ceramic substrate can be provided.

Figure 8A:
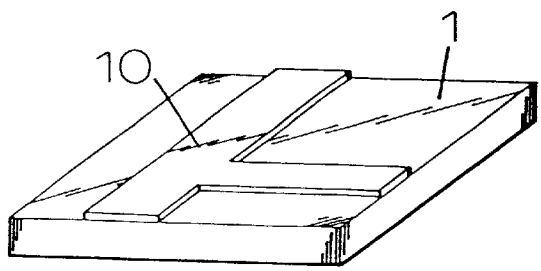
FIGS. 8A, 8B, 8C, 8D, 8E and 8F are schematic views showing a method of coating a copper circuit pattern on a ceramic substrate of the present invention.
Figure 8D:
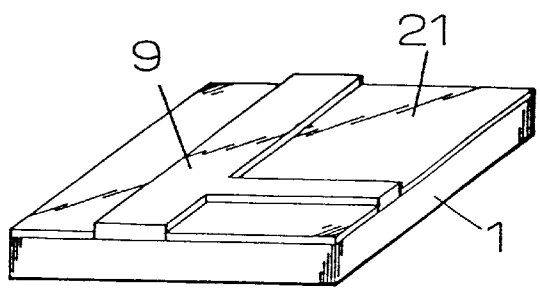
Figure 8B:
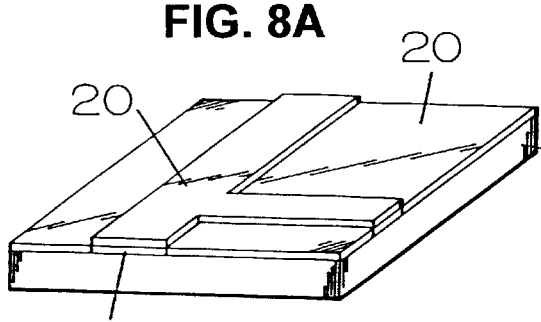
Figure 8E:
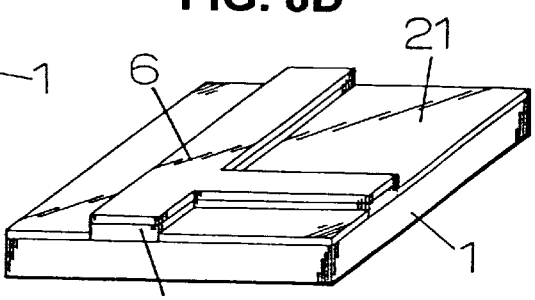
Figure 8C:
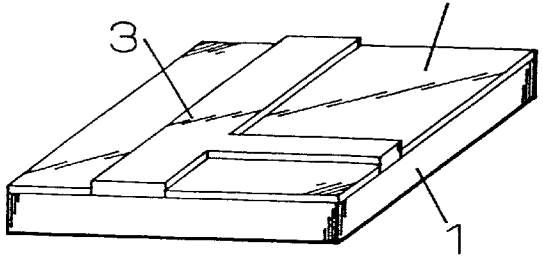
Figure 8F:
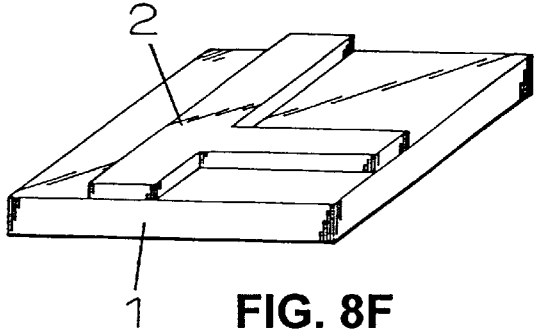

In accordance with the above-explained method, a copper circuit pattern 2 can be formed on a ceramic substrate 1. That is, as shown in FIGS. 8A and 8B, a first undercoat 10 of copper is formed on the ceramic substrate 1 along a circuit pattern, and then a second undercoat 20 of bismuth or vanadium is formed on the circuit pattern of the first undercoat 10 and an exposed area of the ceramic substrate 1 on which the first undercoat 10 is not formed. In this explanation, the second undercoat is made of bismuth. The ceramic substrate having the first and second undercoats is heated in an oxidative atmosphere to obtain a fired undercoat 3 comprising copper oxide particles and a binder phase of copper and bismuth on the ceramic substrate, as shown in FIG. 8C. In this heat-treatment, the exposed second undercoat 20 is also oxidized, so that a bismuth oxide layer 21 is formed on the ceramic substrate 1. The copper oxide particles in the fired undercoat 3 are reduced by the use of a reducing solution to obtain a reduced undercoat 9 having metallic copper particles, as shown in FIG. 8D. The copper particles are partially exposed on a top surface of the reduced undercoat 9. The bismuth oxide layer 21 is not reduced by the reducing solution. A copper film 6 is formed on the top surface of the reduced undercoat 9 by electroless plating. Since the copper film 6 is not deposited on the bismuth oxide layer 21 during the electroless plating, as shown in FIG. 8E, the bismuth oxide layer 21 can be used as a mask pattern for the electroless plating. The bismuth oxide layer 21 can be readily etched and removed by the use of an acid solution to obtain the copper circuit pattern 2 on the ceramic substrate 1, as shown in FIG. 8F.

Figure 9A:
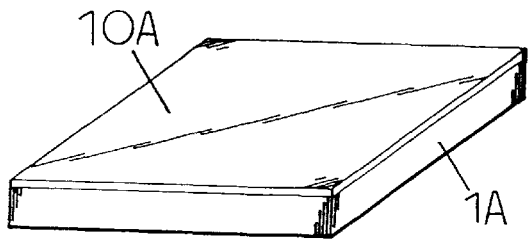
FIGS. 9A, 9B, 9C, 9D, 9E and 9F are schematic views showing another method of coating a copper circuit pattern on a ceramic substrate of the present invention.
Figure 9D:
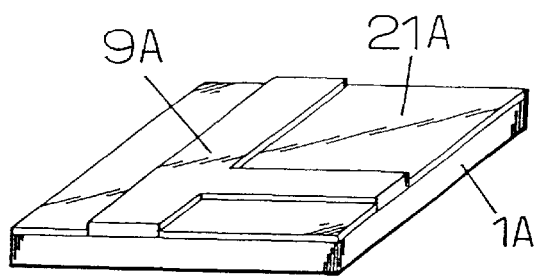
Figure 9B:
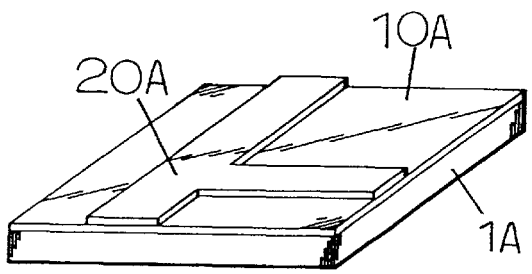
Figure 9E:
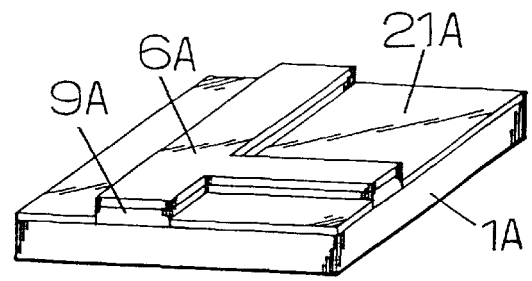
Figure 9C:
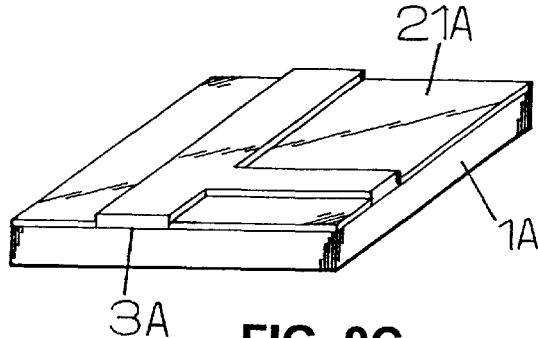
Figure 9F:
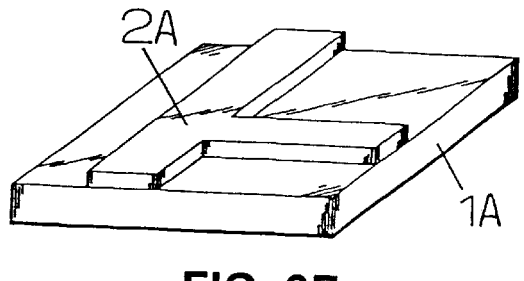

Alternatively, a copper circuit pattern 2A can be formed on a ceramic substrate 1A according to the following method. That is, as shown in FIGS. 9A and 9B, a first undercoat 10A of bismuth or vanadium is formed on the ceramic substrate 1A, and then a second undercoat 20A of copper is formed along a circuit pattern on the first undercoat 10A. In this explanation, the first undercoat is made of bismuth. The ceramic substrate having the first and second undercoats is heated in an oxidative atmosphere to obtain a fired undercoat 3A comprising copper oxide particles and a binder phase of copper and bismuth on the ceramic substrate 1A, as shown in FIG. 9C. In this heat-treatment, an exposed surface of the first undercoat 10A is also oxidized, so that a bismuth oxide layer 21A is formed on the ceramic substrate 1A. Then, the copper oxide particles in the fired undercoat 3A are reduced by the use of a reducing solution to obtain a reduced undercoat 9A having metallic copper particles, as shown in FIG. 9D. The copper particles are partially exposed on a top surface of the reduced undercoat 9A. The bismuth oxide layer 21A is not reduced by the reducing solution. A copper film 6A is formed on the top surface of the reduced undercoat 9A by electroless plating. Since the copper film 6A is not deposited on the bismuth oxide layer 21A during the electroless plating, as shown in FIG. 9E, the bismuth oxide layer 21A can be used as a mask pattern for the electroless plating. The bismuth oxide layer 21 can be readily etched and removed by the use of an acid solution to obtain the copper circuit pattern 2A on the ceramic substrate 1A, as shown in FIG. 9F.

It is preferred that the undercoat comprises a copper powder which is treated by chelating agent of ethylenediamine to form a chelate compound of copper in its surface. This enhances a uniform reduction of the copper oxide particles to the metallic copper particles. Ethylenediaminetetraacetic acid, ethylenediaminediacetic acid, disodium ethylenediaminetetraacetate, or the like, may be utilized as the chelating agent. For example, a copper powder may be dipped into a bath of the chelating agent. Alternatively, the chelating agent may be sprayed to a copper powder. In particular, it is preferred that a first undercoat of copper is deposited on a ceramic substrate from a copper plating solution containing the chelating agent by electroless plating. In addition, it is preferred that a resinate paste containing a copper powder deposited from the copper plating solution is applied on the ceramic substrate to form the undercoat.

A copper film can be also formed on a ceramic substrate according to the following method. That is, an undercoat containing copper is formed on said ceramic substrate. The ceramic substrate having the undercoat is heated at a temperature between 850° C. and 1100° C. in an oxidative atmosphere to obtain a copper oxide layer on the ceramic substrate. The copper oxide layer is then reduced by the use of a reducing solution to obtain a metallic copper layer. Copper is coated on the metallic copper layer to form the copper film on the ceramic substrate.

EXAMPLES 1–5

As listed on Table 1, aluminum oxide ($Al_2O_3$), aluminum nitride (AlN), barium titanate ($BaTiO_3$), silicon carbide (SiC), and zirconium oxide ($ZrO_2$) were used as ceramic substrates. A mixed resinate paste consisting essentially of 2 parts by weight of a bismuth resinate paste (Bi content: 20%) and 8 parts by weight of a copper resinate paste (Cu content: 6%) was printed on a surface of the respective ceramic substrate by screen printing to obtain an undercoat of the mixed paste extending along a circuit pattern on the ceramic substrate. No roughing treatment was performed on the surface of the ceramic substrate prior to the screen printing. After the printed substrate was dried at 125° C. for 10 minutes, it was heated at a temperature of 850° C. for 1 hour in the air to obtain a fired undercoat on the ceramic substrate. The fired undercoat is formed with copper oxide particles and a binder phase containing bismuth and copper. A bismuth content in the fired undercoat is 45 wt %. Then the copper oxide particles were reduced to metallic copper particles by dipping the ceramic substrate having the fired undercoat in a bath of an aqueous solution of boron hydride sodium at a temperature of 80° C. for 5 minutes. A pH of the aqueous solution is 12.5. The copper particles are partially exposed on a top surface of the reduced undercoat. Copper was coated on the top surface of the reduced undercoat by electroless plating to obtain a copper film having a thickness of about 10 μm extending along the circuit pattern on the ceramic substrate.

TABLE 1

|  | Ceramic Substrate | Adhesion Strength (kg/4 mm$^2$) | Bi content in Fired Undercoat (wt %) |
| --- | --- | --- | --- |
| Example 1 | Al$_2$O$_3$ | 4.5 | 45 |
| Example 2 | AlN | 4.3 | 45 |
| Example 3 | BaTiO$_3$ | 4.6 | 45 |
| Example 4 | SiC | 4.2 | 45 |
| Example 5 | ZrO$_2$ | 4.4 | 45 |

Figure 10:
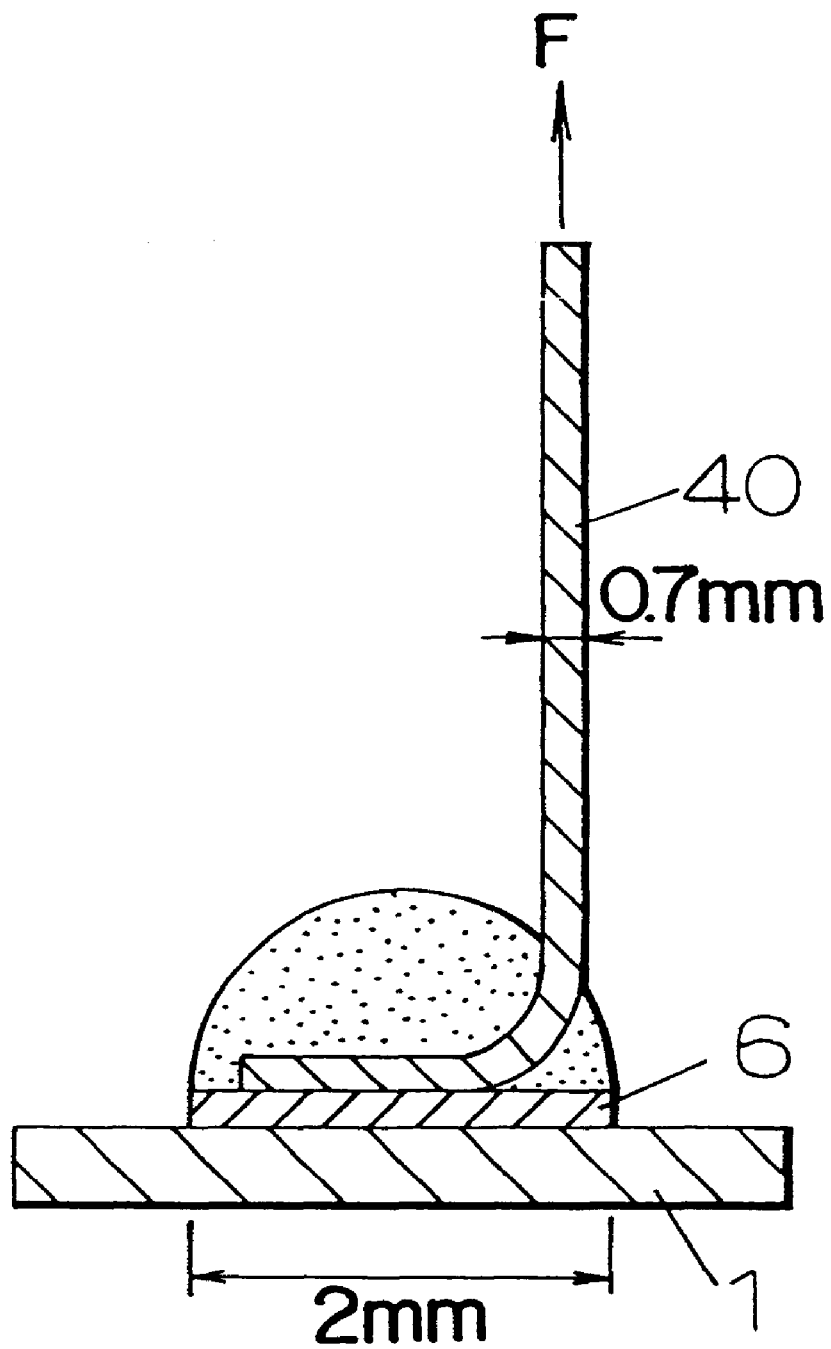
FIG. 10 is a schematic view illustrating a method of the adhesion test.

An adhesion test for measuring an adhesion strength between the copper film and the ceramic substrate was performed according to the following method. That is, as shown in FIG. 10, a tin coated copper wire 40 having a diameter of 0.7 mm is soldered to a square area of 2 mm×2 mm of a copper film 6 formed on a ceramic substrate 1. The copper film 6 is peeled off from the ceramic substrate 1 by pulling the copper wire 40 in a direction shown by the arrow F in FIG. 10. Results of the adhesion tests are shown on Table 1.

EXAMPLES 6–14 AND COMPARATIVE EXAMPLES 1–2

After each of ceramic substrates listed on Table 2 was dipped in a bath of a solution comprising palladium ions, a first undercoat of copper was formed on a surface of the ceramic substrate by electroless plating. In Examples 6–10, first undercoats having different thicknesses were formed on the ceramic substrates of aluminum oxide (Al$_2$O$_3$). In Examples 7, 11 to 14, first undercoats having a thickness of about 0.5 μm were formed on the different ceramic substrates. No roughing treatment was performed prior to the palladium treatment. The first undercoat was etched to obtain a circuit pattern of the first undercoat and an exposed area of the ceramic substrate. A bismuth resinate paste (Bi content: 20%) was printed on both of the first undercoat and the exposed area of the ceramic substrate by screen printing to form a second undercoat of bismuth. After the printed substrate was dried at about 125° C. for 10 minutes, it was heated at a temperature of 850° C. for 1 hour in the air to obtain a fired undercoat extending along the circuit pattern on the ceramic substrate. The fired undercoat is formed with copper oxide particles and a binder phase containing bismuth and copper. As shown in FIG. 2, it is observed that the copper particles have an average grain size of about 1.5 μm, and are uniformly dispersed in the binder phase of the fired undercoat of Example 7. A bismuth content in the fired undercoat of each Examples is listed on Table 2. The second undercoat formed on the exposed area of the ceramic substrate was also oxidized to a bismuth oxide layer by the heat-treatment. The copper particles in the fired undercoat were reduced to metallic copper particles by dipping the ceramic substrate in an aqueous solution of boron hydride sodium at a temperature of 80° C. for 5 minutes. A pH of the aqueous solution is 12.5. The copper particles are partially exposed on a top surface of the reduced undercoat. Copper was coated on the top surface of the reduced undercoat by electroless plating to obtain a copper film having a thickness of about 10 μm extending along the circuit pattern on the ceramic substrate. Copper was not deposited on the bismuth oxide layer. This means that the second undercoat of bismuth directly formed on the ceramic substrate can effect a mask pattern for the electroless plating. After the electroless plating, the bismuth oxide layer can readily etched and removed by an acid solution.

TABLE 2

|  | Ceramic Substrate | Thickness of First Undercoat (μm) | Adhesion Strength (kg/4 mm$^2$) | Bi Content in Fired Undercoat (wt %) |
| --- | --- | --- | --- | --- |
| Example 6 | Al$_2$O$_3$ | 0.05 | 5.2 | 90 |
| Example 7 | Al$_2$O$_3$ | 0.5 | 5.5 | 47 |
| Example 8 | Al$_2$O$_3$ | 1.0 | 5.0 | 31 |
| Example 9 | Al$_2$O$_3$ | 2.0 | 4.8 | 18 |
| Example 10 | Al$_2$O$_3$ | 3.0 | 4.5 | 13 |
| Example 11 | AlN | 0.5 | 5.5 | 47 |
| Example 12 | BaTiO$_3$ | 0.5 | 5.7 | 47 |
| Example 13 | SiC | 0.5 | 4.9 | 47 |
| Example 14 | ZrO$_2$ | 0.5 | 5.1 | 47 |
| Comparative Example 1 | Al$_2$O$_3$ | 0.01 | 0.1 | 98 |
| Comparative Example 2 | Al$_2$O$_3$ | 5.0 | 0.1 | 8 |

In Comparative Examples 1 and 2, copper films having a thickness of about 10 μm were formed on ceramic substrates of Al$_2$O$_3$ according to a substantially same method as Examples 6–14 except that first undercoats having thicknesses of about 0.01 μm and 5.0 μm were formed on the Al$_2$O$_3$ substrates, respectively, and bismuth contents in the fired undercoats are 98 wt % and 8 wt %, respectively.

In each of Examples 6–14 and Comparative Examples 1–2, an adhesion strength between the copper film and the ceramic substrate was measured according to the same manner as the adhesion test in Example 1. Results of the adhesion tests are shown on Table 2. FIG. 5 is a SEM photograph showing a flaking surface of the reduced undercoat of Example 7 after the adhesion test. It is observed that the metallic copper particles are pulled out from the reduced undercoat when the copper film is peeled off from the ceramic substrate, so that a large number of fine dimples are formed on the flaking surface of the reduced undercoat. This provides a great adhesion strength of the copper film which is 5.5 kg/4 mm$^2$, as listed on Table 2. On the contrary, it should be noted that the copper films of Comparative Examples exhibit poor adhesion strength.

EXAMPLES 15–24

A first undercoat of bismuth was formed on a surface of each of ceramic substrates listed on Table 3. In Examples 15–19, a bismuth resinate paste (Bi content: 20%) was printed on the surface of the ceramic substrate by screen printing to form the first undercoat. In Examples 20–24, after the ceramic substrate was dipped in a bath of a solution comprising palladium ions, the first undercoat was formed on the surface of the ceramic substrate by electroless plating of bismuth. No roughing treatment was performed prior to the screen printing or the palladium treatment. A copper resinate paste (Cu content: 6%) was printed on the first undercoat along a predetermined circuit pattern to obtain a second undercoat of copper on the first undercoat. After the ceramic substrate having the first and second undercoats was dried at about 125° C. for 10 minutes, it was heated at a temperature of 850° C. for 1 hour in the air to obtain a fired undercoat extending along the circuit pattern on the ceramic substrate. The fired undercoat is formed with copper oxide particles and a binder phase containing bismuth and copper. A bismuth content in the fired undercoat of each Examples is listed on Table 3. The first undercoat of bismuth, on which the second undercoat of copper was not formed, was also oxidized to a bismuth oxide layer by the heat-treatment. The copper oxide particles in the fired undercoat were reduced to metallic copper particles by dipping the ceramic substrate in an aqueous solution of boron hydride sodium at a temperature of 80° C. for 5 minutes. A pH of the aqueous solution is 12.5. The metallic copper particles are partially exposed on a top surface of the reduced undercoat.

TABLE 3

|  | Ceramic Substrate | Method of forming First Undercoat | Adhesion Strength (kg/4 mm$^2$) | Bi Content in Fired Undercoat (wt %) |
| --- | --- | --- | --- | --- |
| Example 15 | Al$_2$O$_3$ | Resinate paste | 5.0 | 77 |
| Example 16 | AlN | Resinate paste | 4.9 | 77 |
| Example 17 | BaTiO$_3$ | Resinate paste | 5.3 | 77 |
| Example 18 | SiC | Resinate paste | 4.8 | 77 |
| Example 19 | ZrO$_2$ | Resinate paste | 5.2 | 77 |
| Example 20 | Al$_2$O$_3$ | Plating | 4.4 | 80 |
| Example 21 | AlN | Plating | 4.3 | 80 |
| Example 22 | BaTiO$_3$ | Plating | 4.6 | 80 |
| Example 23 | SiC | Plating | 4.2 | 80 |
| Example 24 | ZrO$_2$ | Plating | 4.9 | 80 |

Copper was coated on the top surface of the reduced undercoat by electroless plating to obtain a copper film having a thickness of about 10 μm along the circuit pattern on the ceramic substrate. Copper was not coated on the bismuth oxide layer. This means that the first undercoat of bismuth can effect a mask pattern for the electroless plating. After the electroless plating, the bismuth oxide layer was readily etched and removed by an acid solution.

In each of the Examples 15–24, an adhesion strength between the copper film and the ceramic substrate was measured in accordance with the same manner as the adhesion test in Example 1. Results of the adhesion tests are shown on Table 3.

EXAMPLES 25–28

Copper films having a thickness of about 10 μm of Examples 25–28 were formed on ceramic substrates of aluminum oxide in accordance with a substantially same method as Example 7 except that bismuth resinate pastes having different bismuth contents were used to form second undercoats of bismuth, as listed on Table 4.

In each of Examples 25–28, an adhesion strength between the copper film and the ceramic substrate was measure in accordance with the same manner as the adhesion test in Example 1. Results of the adhesion tests are shown on Table 4.

TABLE 4

|  | Ceramic Substrate | Bi content in Second Undercoat (wt %) | Adhesion Strength (kg/4 mm$^2$) | Bi content in Fired Undercoat (wt %) |
| --- | --- | --- | --- | --- |
| Example 25 | Al$_2$O$_3$ | 15 | 5.4 | 40 |
| Example 26 | Al$_2$O$_3$ | 12 | 4.8 | 35 |
| Example 27 | Al$_2$O$_3$ | 10 | 2.5 | 31 |
| Example 28 | Al$_2$O$_3$ | 12 | 1.5 | 18 |

EXAMPLES 29–32

Copper films having a thickness of about 10 μm of Examples 29–32 were formed on ceramic substrates of aluminum oxide in accordance with the substantially same method as Example 15 except that the ceramic substrates having first and second undercoats were heated in the air under different conditions with respect to temperature and time, as listed on Table 5.

In each of Examples 29–32, an adhesion strength between the copper film and the ceramic substrate was measured in accordance with the same manner as the adhesion test in Example 1. Results of the adhesion tests are shown on Table 5.

TABLE 5

|  | Ceramic Substrate | Conditions of Heat-treatment | | Adhesion Strength (kg/4 mm$^2$) | Bi Content in Fired Undercoat (wt %) |
| --- | --- | --- | --- | --- | --- |
|  |  | Temp. (° C.) | Time (min.) |  |  |
| Example 29 | Al$_2$O$_3$ | 600 | 60 | 4.0 | 77 |
| Example 30 | Al$_2$O$_3$ | 700 | 60 | 4.6 | 77 |
| Example 31 | Al$_2$O$_3$ | 950 | 15 | 5.1 | 77 |
| Example 32 | Al$_2$O$_3$ | 1100 | 5 | 4.0 | 77 |

EXAMPLES 33 AND 34

In Example 33, after a copper powder having an average particle size of about 1 μm was dipped in an alkali saturated solution of disodium ethylenediaminetetraacetate, while agitating the saturated solution, the copper powder was removed from the saturated solution by filtration, and dried to obtain a first copper powder. 1.05 parts by weight of the first copper powder were mixed with 2 parts by weight of a bismuth resinate paste (Bi content: 20%) to obtain a mixed resinate paste of bismuth and copper. A copper film having a thickness of about 10 μm was formed on a ceramic substrate of aluminum oxide in accordance with the substantially same method as Example 1 except for using the mixed resinate paste prepared in Example 33.

In Example 34, a second copper powder was deposited from a copper plating solution comprising disodium ethylenediaminetetraacetate by adding boron hydride sodium into the plating solution. 1.05 parts by weight of the second copper powder were mixed with 2 parts by weight of a bismuth resinate paste (Bi content: 20%) to obtain a mixed resinate paste of bismuth and copper. A copper film having a thickness of about 10 μm was formed on a ceramic substrate of aluminum oxide in accordance with the substantially same method as Example 1 except for using the mixed resinate paste prepared in Example 34.

In each of Examples 33 and 34, an adhesion strength between the copper film and the ceramic substrate was measured in accordance with the same manner as the adhesion test in Example 1. Results of the adhesion tests are shown on Table 6.

TABLE 6

|  | Ceramic Substrate | Adhesion Strength (kg/4 mm$^2$) | Bi Content in Fired Undercoat (wt %) |
| --- | --- | --- | --- |
| Example 33 | Al$_2$O$_3$ | 4.8 | 28 |
| Example 34 | Al$_2$O$_3$ | 5.2 | 28 |

EXAMPLES 35–39

As listed on Table 7, aluminum oxide (Al$_2$O$_3$), aluminum nitride (AlN), barium titanate (BaTiO$_3$), silicon carbide (SiC), and zirconium oxide (ZrO$_2$) were used as ceramic substrates. A mixed resinate paste consisting essentially of 5 parts by weight of a vanadium resinate paste (V content: 3.9%) and 5 parts by weight of a copper resinate paste (Cu content: 6.4%) was printed on a surface of the respective ceramic substrate by screen printing to obtain an undercoat of the mixed paste extending along a circuit pattern on the ceramic substrate. No roughing treatment was performed on the surface of the ceramic substrate prior to the screen printing. After the printed substrate was dried at 125° C. for 10 minutes, it was heated at a temperature of 550° C. for 1 hour in the air to obtain a fired undercoat on the ceramic substrate. The fired undercoat is formed with copper oxide particles and a binder phase containing vanadium and copper. A vanadium content in the fired undercoat is 38 wt %. The copper oxide particles were reduced to metallic copper particles by dipping the ceramic substrate having the fired undercoat in an aqueous solution of boron hydride sodium at a temperature of 80° C. for 5 minutes. A pH of the aqueous solution is 12.5. The copper particles are partially exposed on a top surface of the reduced undercoat. Copper was coated on the top surface of the reduced undercoat by electroless plating to obtain a copper film having a thickness of about 10 μm extending along the circuit pattern on the ceramic substrate. A copper content of the copper film is more than 99 wt %.

In each of the Examples 35–39, an adhesion strength between the copper film and the ceramic substrate was measured in accordance with the same manner as the adhesion test in Example 1. Results of the adhesion tests are shown on Table 7.

TABLE 7

|  | Ceramic Substrate | Adhesion Strength (kg/4 mm$^2$) | V Content in Fired Undercoat (wt %) |
| --- | --- | --- | --- |
| Example 35 | Al$_2$O$_3$ | 4.2 | 38 |
| Example 36 | AlN | 4.1 | 38 |
| Example 37 | BaTiO$_3$ | 4.5 | 38 |
| Example 38 | SiC | 4.0 | 38 |
| Example 39 | ZrO$_2$ | 4.1 | 38 |

EXAMPLES 40–48 AND COMPARATIVE EXAMPLES 3 AND 4

After each of ceramic substrates listed on Table 8 was treated by a solution comprising palladium ions, a first undercoat of copper was formed on the substrate surface by electroless plating. No roughing treatment was performed prior to the palladium treatment. In Examples 40–44, first undercoats having different thicknesses were formed on the ceramic substrates of aluminum oxide (Al$_2$O$_3$). In Examples 41, 45 to 48, first undercoats having a thickness of about 0.5 μm were formed on the different ceramic substrates. A vanadium resinate paste (V content: 3.9%) was printed on the first undercoat by screen printing to form a second undercoat of vanadium thereon. After the ceramic substrate having the first and second undercoats was dried at about 125° C. for 10 minutes, it was heated at a temperature of 550° C. for 1 hour in the air to obtain a fired undercoat on the ceramic substrate. The fired undercoat is formed with copper oxide particles and a binder phase containing vanadium and copper. Vanadium contents in the fired undercoats are listed on Table 8. The copper oxide particles were reduced to metallic copper particles by dipping the ceramic substrate having the fired undercoat in an aqueous solution of boron hydride sodium at a temperature of 80° C. for 5 minutes. A pH of the aqueous solution is 12.5. The copper particles are partially exposed on a top surface of the reduced undercoat. Copper was coated on the top surface of the reduced undercoat by electroless plating to obtain a copper film having a thickness of about 10 μm on the ceramic substrate.

TABLE 8

|  | Ceramic Substrate | Thickness of First Undercoat (μm) | Adhesion Strength (kg/4 mm$^2$) | V Content in Fired Undercoat (wt %) |
| --- | --- | --- | --- | --- |
| Example 40 | Al$_2$O$_3$ | 0.05 | 4.8 | 63 |
| Example 41 | Al$_2$O$_3$ | 0.5 | 5.0 | 15 |
| Example 42 | Al$_2$O$_3$ | 1.0 | 5.2 | 8 |
| Example 43 | Al$_2$O$_3$ | 2.0 | 4.8 | 4 |
| Example 44 | Al$_2$O$_3$ | 3.0 | 4.5 | 3 |
| Example 45 | AlN | 0.5 | 5.5 | 15 |
| Example 46 | BaTiO$_3$ | 0.5 | 5.7 | 15 |
| Example 47 | SiC | 0.5 | 4.9 | 15 |
| Example 48 | ZrO$_2$ | 0.5 | 5.1 | 15 |
| Comparative Example 3 | Al$_2$O$_3$ | 0.01 | 0.1 | 90 |
| Comparative Example 4 | Al$_2$O$_3$ | 5.0 | 0.1 | 2 |

In Comparative Examples 3 and 4, copper films having a thickness of about 10 μm were formed on Al$_2$O$_3$ substrates according to a substantially same method as Examples 40–48 except that first undercoats having thicknesses of about 0.01 μm and 5.0 μm are formed on the Al$_2$O$_3$ substrates, respectively, and vanadium contents in fired undercoats are 90 wt % and 2 wt %, respectively.

In each of Examples 40–48 and Comparative Examples 3 and 4, an adhesion strength between the copper film and the ceramic substrate was measured in accordance with the same manner as the adhesion test in Example 1. Results of the adhesion tests are shown on Table 8.

EXAMPLES 49–53

After a vanadium resinate paste (V content: 3.9%) was printed on a surface of each of ceramic substrates listed on Table 9 by screen printing, the printed substrate is dried at 125° C. for 10 minutes to form a first undercoat of vanadium on the ceramic substrate. No roughing treatment was performed on the substrate surface prior to the screen printing. After a copper resinate paste (Cu content: 6%) was printed on the first undercoat by screen printing, the printed substrate is dried at 125° C. for 10 minutes to obtain a second undercoat of copper on the first undercoat. The ceramic substrate having the first and second undercoats was heated at the temperature of 550° C. for 1 hour in the air to obtain a fired undercoat on the ceramic substrate. The fired undercoat is formed with copper oxide particles and a binder phase containing vanadium and copper. A vanadium content in the fired undercoat is 39 wt %. The copper oxide particles were reduced to metallic copper particles by dipping the ceramic substrate having the fired undercoat in an aqueous solution of boron hydride sodium at a temperature of 80° C. for 5 minutes. A pH of the aqueous solution is 12.5. The copper particles are partially exposed on a top surface of the reduced undercoat. Copper was coated on the top surface of the reduced undercoat by electroless plating to obtain a copper film having a thickness of about 10 μm on the ceramic substrate.

In each of the Examples 49–53, an adhesion strength between the copper film and the ceramic substrate was measured in accordance with the same manner as the adhesion test in Example 1. Results of the adhesion tests are shown on Table 9.

TABLE 9

| | Ceramic Substrate | Adhesion Strength (kg/4 mm$^2$) | V Content in Fired Undercoat (wt %) |
|---|---|---|---|
| Example 49 | Al$_2$O$_3$ | 5.1 | 39 |
| Example 50 | AlN | 5.3 | 39 |
| Example 51 | BaTiO$_3$ | 5.5 | 39 |
| Example 52 | SiC | 4.9 | 39 |
| Example 53 | ZrO$_2$ | 4.7 | 39 |

EXAMPLES 54 AND 55

Copper films having a thickness of about 10 μm of Examples 54 and 55 were formed on ceramic substrates of aluminum oxide in accordance with a substantially same method as Example 49 except that the ceramic substrates having first and second undercoats were heated at different temperatures in the air, as listed on Table 10.

In each of Examples 54 and 55, an adhesion strength between the copper film and the ceramic substrate was measured in accordance with the same manner as the adhesion test in Example 1. Results of the adhesion tests are shown on Table 10.

TABLE 10

| | Ceramic Substrate | Oxidizing Temp. (° C.) | Adhesion Strength (kg/4 mm$^2$) | V Content in Fired Undercoat (wt %) |
|---|---|---|---|---|
| Example 54 | Al$_2$O$_3$ | 500 | 4.0 | 39 |
| Example 55 | Al$_2$O$_3$ | 600 | 5.0 | 39 |

EXAMPLE 56

A ceramic substrate of aluminum oxide (Al$_2$O$_3$) was used. A mixed resinate paste consisting essentially of 1 part by weight of a copper powder having an average grain size of 1 μm and 19 parts by weight of a vanadium resinate paste (V content: 3.9%) was printed on a surface of the ceramic substrate by screen printing to obtain an undercoat of the mixed paste extending along a circuit pattern thereon. No roughing treatment was performed on the surface of the ceramic substrate prior to the screen printing. After the printed substrate was dried at 125° C. for 10 minutes, it was heated at a temperature of 450° C. for 1 hour in the air to obtain a fired undercoat on the ceramic substrate. The fired undercoat is formed with copper oxide particles and a binder phase containing vanadium and copper. A vanadium content in the fired undercoat is 43 wt %. Then, the copper oxide particles were reduced to metallic copper particles by dipping the ceramic substrate having the fired undercoat in a bath of an aqueous solution of boron hydride sodium at a temperature of 80° C. for 5 minutes. A pH of the aqueous solution is 12.5. The copper particles are partially exposed on a top surface of the reduced undercoat. Copper was coated on the top surface of the reduced undercoat by electroless plating to obtain a copper film having a thickness of about 10 μm extending along the circuit pattern on the ceramic substrate.

An adhesion strength between the copper film and the ceramic substrate was measured in accordance with the same manner as the adhesion test in Example 1. A result of the adhesion test are shown on Table 11.

TABLE 11

| | Ceramic Substrate | Adhesion Strength (kg/4 mm$^2$) | V content in Fired Undercoat (wt %) |
|---|---|---|---|
| Example 56 | Al$_2$O$_3$ | 4.1 | 43 |

EXAMPLE 57

A copper film having a thickness of about 10 μm was formed on a ceramic substrate of aluminum oxide in accordance with a substantially same method as Example 56 except that a mixed resinate paste consisting essentially of 1 part by weight of a copper powder having an average grain size of 1 μm and 1 part by weight of a vanadium resinate paste (V content: 3.9%) was printed on a surface of the ceramic substrate, and the printed substrate was heated at a temperature of 1100° C. for 15 minutes in the air to obtain a fired undercoat on the ceramic substrate.

An adhesion strength between the copper film and the ceramic substrate was measured in accordance with the same manner as the adhesion test in Example 1. A result of the adhesion test are shown on Table 12.

TABLE 12

| | Ceramic Substrate | Adhesion Strength (kg/4 mm$^2$) | V content in Fired Undercoat (wt %) |
|---|---|---|---|
| Example 57 | Al$_2$O$_3$ | 4.8 | 4 |

EXAMPLES 58 AND 59

In Example 58, after a copper powder having an average particle size of about 1 μm was dipped in a bath of an alkali saturated solution of disodium ethylenediaminetetraacetate, while agitating the saturated solution, the copper powder was removed from the saturated solution by filtration, and then dried to obtain a first copper powder. 3 parts by weight of the first copper powder were mixed with 7 parts by weight of a vanadium resinate paste (V content: 3.9%) to obtain a mixed resinate paste of vanadium and copper. A copper film having a thickness of about 10 μm was formed on a ceramic substrate of aluminum oxide in accordance with a substantially same method as Example 35 except for using the mixed resinate paste prepared in Example 58.

In Example 59, a second copper powder was deposited from a copper plating solution comprising disodium ethylenediaminetetraacetate by adding boron hydride sodium into the plating solution. 3 parts by weight of the second copper powder were mixed with 7 parts by weight of a vanadium resinate paste (V content: 3.9%) to obtain a mixed resinate paste of vanadium and copper. A copper film having a thickness of about 10 μm was formed on a ceramic substrate of aluminum oxide in accordance with a substantially same method as Example 35 except for using the mixed resinate paste prepared in Example 59.

TABLE 13

| | Ceramic Substrate | Adhesion Strength (kg/4 mm$^2$) | V Content in Fired Undercoat (wt %) |
|---|---|---|---|
| Example 58 | Al$_2$O$_3$ | 4.8 | 8 |
| Example 59 | Al$_2$O$_3$ | 5.2 | 8 |

In each of Examples 58 and 59, an adhesion strength between the copper film and the ceramic substrate was measured in accordance with the same manner as the adhesion test in Example 1. Results of the adhesion tests are shown on Table 13.

EXAMPLES 60 AND 61

Copper films having a thickness of about 10 μm of Examples 60 and 61 were formed on ceramic substrates in accordance with a substantially same method as Example 49 except that the copper films were formed on reduced undercoats by electroplating and a conventional sputtering method, respectively. A copper content of each copper film is more than 99 wt %.

In each of Examples 60 and 61, an adhesion strength between the copper film and the ceramic substrate was measured in accordance with the same manner as the adhesion test in Example 1. Results of the adhesion tests are shown on Table 14.

TABLE 14

|  | Ceramic Substrate | Adhesion Strength (kg/4 mm$^2$) | V Content in Fired Undercoat (wt %) |
| --- | --- | --- | --- |
| Example 60 | Al$_2$O$_3$ | 5.1 | 39 |
| Example 61 | Al$_2$O$_3$ | 5.0 | 39 |

EXAMPLE 62–65

After a surface of a ceramic substrate of aluminum oxide was treated by a solution comprising palladium ions, a first undercoat of copper was formed on the substrate surface by electroless plating. A thickness of the first undercoat is about 0.5 μm. A bismuth resinate paste (Bi content: 10 wt %) was printed on the first undercoat by screen printing to form a second undercoat of bismuth. After the ceramic substrate having the first and second undercoats was dried at about 125° C. for 10 minutes, it was heated at a temperature of 850° C. for 1 hour in the air to obtain a fired undercoat on the ceramic substrate. The fired undercoat is formed with copper oxide particles and a binder phase containing vanadium and copper. A vanadium content in the fired undercoat is 31 wt %. In Examples 62 and 63, the copper oxide particles were reduced to metallic copper particles by dipping the ceramic substrate having the fired undercoat in an aqueous solution of boron hydride sodium at a temperature listed on Table 15 for 5 minutes. A pH of the aqueous solution is 12.5. In Examples 64 and 65, the copper oxide particles were reduced to metallic copper particles by dipping the ceramic substrate having the fired undercoat in an aqueous solution of dimethylamine borane at a temperature listed on Table 15 for 5 minutes. A pH of the aqueous solution is 4.1. The copper particles are partially exposed on a top surface of the reduced undercoat. Subsequently, copper was coated on the top surface of the reduced undercoat by electroless plating to obtain a copper film having a thickness of about 10 μm on the ceramic substrate.

In each of Examples 62–65, an adhesion strength between the copper film and the ceramic substrate was measured in accordance with the same manner as the adhesion test in Example 1. Results of the adhesion tests are shown on Table 15.

TABLE 15

|  | Reducing Solution | Reducing Temp. (° C.) | Adhesion Strength (kg/4 mm$^2$) | V Content in Fired Undercoat (wt %) |
| --- | --- | --- | --- | --- |
| Example 62 | Boron Hydride Sodium | 40 | 4.4 | 31 |
| Example 63 | Boron Hydride Sodium | 80 | 4.5 | 31 |
| Example 64 | Dimethylamine Borane | 25 | 4.6 | 31 |
| Example 65 | Dimethylamine Borane | 40 | 4.6 | 31 |

EXAMPLES 66–70

A mixed resinate paste consisting essentially of a copper resinate paste (Cu content: 3.7 wt %), a bismuth resinate paste (Bi content: 10 wt %), and a vanadium resinate paste (V content: 1.9 wt %) was printed on a surface of each of ceramic substrates listed on Table 16 by screen printing to form an undercoat of the mixed paste. After the undercoat was dried at 125° C. for 10 minutes, it was heated at a temperature of 600° C. for 1 hour in the air to obtain a fired undercoat on the ceramic substrate. The fired undercoat is formed with copper oxide particles and a binder phase containing vanadium, bismuth and copper. Contents of vanadium and bismuth in the fired undercoat are 64 wt % and 13 wt %, respectively. The copper oxide particles were reduced to metallic copper particles by dipping the ceramic substrate having the fired undercoat in a bath of an aqueous solution of boron hydride sodium at a temperature of 80° C. for 5 minutes. A pH of the aqueous solution is 12.5. The copper particles are partially exposed on a top surface of the reduced undercoat. Copper was coated on the top surface of the reduced undercoat by electroless plating to obtain a copper film having a thickness of about 10 μm on the ceramic substrate.

In each of Examples 66–70, an adhesion strength between the copper film and the ceramic substrate was measured in accordance with the same manner as the adhesion test in Example 1. Results of the adhesion tests are shown on Table 16.

TABLE 16

|  | Ceramic Substrate | Adhesion Strength (kg/4 mm$^2$) | Bi Content in Fired Undercoat (wt %) | V Content in Fired Undercoat (wt %) |
| --- | --- | --- | --- | --- |
| Example 66 | Al$_2$O$_3$ | 4.8 | 64 | 13 |
| Example 67 | AlN | 4.5 | 64 | 13 |
| Example 68 | BaTiO$_3$ | 5.0 | 64 | 13 |
| Example 69 | SiC | 4.2 | 64 | 13 |
| Example 70 | ZrO$_2$ | 4.5 | 64 | 13 |

COMPARATIVE EXAMPLES 5–9

After a surface of each of ceramic substrates listed on Table 17 was treated by a solution comprising palladium ions, an undercoat of copper was formed on the substrate surface by electroless plating. A thickness of the undercoat is about 1 μm. The ceramic substrate having the undercoat was cleaned with water, dried, and then heated at a temperature of 500° C. for 30 minutes in the air to obtain a copper oxide layer. The copper oxide layer was reduced to a metallic copper layer by heating it in a hydrogen flow at the temperature of 500° C. for 30 minutes. Subsequently, copper was coated on the metallic copper layer by electroless plating to obtain a copper film having a thickness of about 10 μm on the ceramic substrate.

In each of Comparative Examples 5–9, an adhesion strength between the copper film and the ceramic substrate was measured in accordance with the same manner as the adhesion test in Example 1. Results of the adhesion tests are shown on Table 17.

TABLE 17

| | Ceramic Substrate | Adhesion Strength (kg/4 mm$^2$) |
|---|---|---|
| Comparative Example 5 | Al$_2$O$_3$ | 0.2 |
| Comparative Example 6 | AlN | 0.3 |
| Comparative Example 7 | BaTiO$_3$ | 0.2 |
| Comparative Example 8 | SiC | 0.2 |
| Comparative Example 9 | ZrO$_2$ | 0.3 |

EXAMPLES 71–77

Ceramic substrates of aluminum oxide (Al$_2$O$_3$), aluminum nitride (AlN), barium titanate (BaTiO$_3$), silicon carbide (SiC), and zirconium oxide (ZrO$_2$) were used as ceramic substrates. An undercoat of copper was formed on a surface of each of the ceramic substrates by electroless plating, sputtering, or a screen printing of a copper resinate paste, as listed on Table 18. In Examples 71–75, the substrate surface was treated with a solution comprising palladium ions prior to the electroless plating. In Examples 76 and 77, no roughing treatment was performed to the substrate surface prior to the formation of the undercoat. A thickness of the undercoat is about 0.5 μm. After the ceramic substrate having the undercoat was heated in the air at a temperature of 1000° C. for 45 minutes to form a copper oxide layer on the ceramic substrate. The copper oxide layer was reduced to a metallic copper layer by dipping it in a bath of an aqueous solution of boron hydride sodium at a temperature of 80° C. A pH of the aqueous solution is 12.5. Copper was coated on the metallic copper layer by electroless plating to obtain a copper film having a thickness of about 10 μm on the ceramic substrate. Then, a circuit pattern of the copper film was formed on the ceramic substrate by a conventional photoresist method.

In each of Examples 71–77, an adhesion strength between the copper film and the ceramic substrate was measured in accordance with the same manner as the adhesion test in Example 1. Results of the adhesion tests are shown on Table 18.

TABLE 18

| | Ceramic Substrate | Method of forming Undercoat | Adhesion Strength (kg/4 mm$^2$) |
|---|---|---|---|
| Example 71 | Al$_2$O$_3$ | Electroless Plating | 4.2 |
| Example 72 | AlN | Electroless Plating | 4.1 |
| Example 73 | BaTiO$_3$ | Electroless Plating | 4.8 |
| Example 74 | SiC | Electroless Plating | 3.7 |
| Example 75 | ZrO$_2$ | Electroless Plating | 4.7 |
| Example 76 | Al$_2$O$_3$ | Sputtering | 4.1 |
| Example 77 | Al$_2$O$_3$ | Screen Printing | 3.8 |

EXAMPLES 78 and 79

After a surface of a ceramic substrate of aluminum oxide was treated by a solution comprising palladium ions, an undercoat of copper was formed on the substrate surface by electroless plating. A thickness of the undercoat is about 0.5 μm. A patterning of the undercoat was performed by a photoresist method to obtain a circuit pattern of the undercoat. No roughing treatment was performed to the substrate surface prior to the formation of the undercoat. A masking paint consisting essentially of a zirconium oxide powder having the average particle size of 0.1 μm and methyl cellulose was sprayed to the ceramic substrate, and then dried. After the ceramic substrate having the undercoat was heated in the air under conditions listed on Table 19 to form a copper oxide layer extending along the circuit pattern on the ceramic substrate by an ultrasonic cleaning with water. Subsequently, the copper oxide layer was reduced to a metallic copper layer by dipping it in a bath of an aqueous solution of boron hydride sodium at a temperature of 80° C. A pH of the aqueous solution is 12.5. Copper was coated on the metallic copper layer by electroless plating to obtain a copper film having a thickness of about 10 μm on the ceramic substrate.

In each of Examples 78–79, an adhesion strength between the copper film and the ceramic substrate was measured in accordance with the same manner as the adhesion test in Example 1. Results of the adhesion tests are Table 19.

TABLE 19

| | Ceramic Substrate | Conditions of Heat-treatment | | Adhesion Strength (kg/4 mm$^2$) |
|---|---|---|---|---|
| | | Temp. (° C.) | Time (min.) | |
| Example 78 | Al$_2$O$_3$ | 1000 | 45 | 4.0 |
| Example 79 | Al$_2$O$_3$ | 1100 | 10 | 4.1 |

EXAMPLES 80–82

Copper films having a thickness of about 10 μm of Examples 80–82 were formed on ceramic substrates of aluminum oxide in accordance with a substantially same method as Example 78 except that the ceramic substrate having an undercoat of copper was heated in the air under conditions listed on Table 20 to form a copper oxide layer on the ceramic substrate, and a masking paint was not sprayed prior to the heat-treatment.

In each of Examples 80–82, an adhesion strength between the copper film and the ceramic substrate was measured in accordance with the same manner as the adhesion test in Example 1. Results of the adhesion tests are shown on Table 20.

TABLE 20

| | Ceramic Substrate | Conditions of Heat-treatment | | Adhesion Strength (kg/4 mm$^2$) |
|---|---|---|---|---|
| | | Temp. (° C.) | Time (min.) | |
| Example 80 | Al$_2$O$_3$ | 850 | 360 | 3.1 |
| Example 81 | Al$_2$O$_3$ | 1000 | 45 | 4.0 |
| Example 82 | Al$_2$O$_3$ | 1100 | 10 | 4.1 |

The results of the adhesion tests in Examples 1–82 show that the present method can provide excellent adhesion strength between the copper film and the ceramic substrate, as compared with Comparative Examples 1–9. In addition, these Examples show that the excellent adhesion strength can be obtained without using an expensive furnace for controlling a reduction atmosphere at a high temperature. In particular, when the copper film is formed on the ceramic substrate according to the present method using an undercoat containing copper and bismuth and/or vanadium, it is possible to provide an adhesion strength of 5 kg/4 mm² or more.

What is claimed is:

1. A method of coating a copper film on a ceramic substrate, said method comprising the steps of:

forming an undercoat containing copper and bismuth on said ceramic substrate;

heating said ceramic substrate having said undercoat in an oxidative atmosphere at a temperature between 600 and 1100° C. to obtain a fired undercoat on said ceramic substrate, said fired undercoat being formed with copper oxide particles and a binder phase containing bismuth and copper for bonding between adjacent copper oxide particles, said fired undercoat containing 10 to 90 wt % bismuth;

reducing said copper oxide particles by the use of a reduced solution to obtain a reduced undercoat having metallic copper particles, said copper particles being partially exposed on a top surface of said reduced undercoat; and coating copper on said top surface of said reduced undercoat to form said copper film on said ceramic substrate.

2. A method as set forth in claim 1, wherein said undercoat is formed on said ceramic substrate by the use of a mixed resinate paste in which a copper powder is mixed with a bismuth resinate paste.

3. A method as set forth in claim 1, wherein said copper oxide particles have an average grain size of 0.1 to 5 μm.

4. A method as set forth in claim 3, wherein said average grain size of said copper oxide particles is about 1.5 μm.

5. A method of coating a copper film on a ceramic substrate, said method comprising the steps of:

forming an undercoat containing copper and bismuth on said ceramic substrate;

heating said ceramic substrate having said undercoat in an oxidative atmosphere at a temperature between 800 and 950° C. to obtain a fired undercoat on said ceramic substrate, said fired undercoat being formed with copper oxide particles and a binder phase containing bismuth and copper for bonding between adjacent copper oxide particles, said fired undercoat contains 30 to 60 wt % bismuth;

reducing said copper oxide particles by the use of a reduced solution to obtain a reduced undercoat having metallic copper particles, said copper particles being partially exposed on a top surface of said reduced undercoat; and coating copper on said top surface of said reduced undercoat to form said copper film on said ceramic substrate.

6. A method as set forth in claim 1, wherein said copper coating is performed by electroless plating.

7. A method as set forth in claim 1, wherein said copper oxide particles are reduced at a temperature between 20 to 100° C.

8. A method as set forth in claim 1, wherein said reducing solution is one of dimethylamine borane and a boron hydride salt.

9. A method as set forth in claim 1, wherein said undercoat comprises a copper powder which is treated by a chelating agent of ethylenediamine to form a chelate compound of copper on a surface of the copper powder.

10. A method as set forth in claim 1, wherein said undercoat comprises a copper powder which is deposited from a copper plating solution including a chelating agent of ethylenediamine.

11. A method of coating a copper film on a ceramic substrate, said method comprising:

forming a first undercoat of one of copper and bismuth on said ceramic substrate;

forming a second undercoat of the other one on said first undercoat;

heating said ceramic substrate having said first and said second undercoats in an oxidative atmosphere at a temperature between 600 and 1100° C. to obtain a fired undercoat on said ceramic substrate, said fired undercoat being formed with copper oxide particles and a binder phase containing bismuth and copper for bonding between adjacent copper oxide particles, said fired undercoat containing 10 to 90 wt % bismuth;

reducing said copper oxide particles by the use of a reduced solution to obtain a reduced undercoat having metallic copper particles, said copper particles being partially exposed on a top surface of said reduced undercoat; and coating copper on said top surface of said reduced undercoat to form said copper film on said ceramic substrate.

* * * * *